United States Patent [19]
Korenaga et al.

[11] Patent Number: 5,518,550
[45] Date of Patent: May 21, 1996

[54] STAGE APPARATUS FOR AN EXPOSURE APPARATUS INCLUDING A CONTANT TENSION SPRING FOR CANCELING OUT A GRAVITATIONAL FORCE OF A MOVABLE STAGE BY A TENSILE FORCE

[75] Inventors: Nobusige Korenaga, Sagamihara; Masamichi Saito, Inagi, both of Japan

[73] Assignee: Canon Kabushiki Kaisha, Tokyo, Japan

[21] Appl. No.: 322,470

[22] Filed: Oct. 14, 1994

[30] Foreign Application Priority Data

Oct. 15, 1993 [JP] Japan ..................... 5-281909

[51] Int. Cl.⁶ ................................................. C23C 16/00
[52] U.S. Cl. ............... 118/729; 118/500; 250/442.11; 269/73
[58] Field of Search ..................... 118/721, 728, 118/729, 500, 503; 269/46, 55, 56, 58, 60, 61, 903, 21, 71, 73; 378/34, 64, 68, 69, 79, 208, 391; 250/442.11, 440.11, 453.11; 248/178; 359/342

[56] References Cited

U.S. PATENT DOCUMENTS

| | | | |
|---|---|---|---|
| 3,155,383 | 11/1964 | Whitmore | 269/58 |
| 4,492,356 | 1/1985 | Taniguchi | 248/346 |
| 4,896,869 | 1/1990 | Takekoshi | 269/60 |
| 4,993,696 | 2/1991 | Furukawa | 269/73 |
| 5,001,351 | 3/1991 | Boksem | 250/442.1 |
| 5,073,912 | 12/1991 | Kobayashi | 378/34 |
| 5,214,290 | 5/1993 | Sakai | 250/492.2 |
| 5,241,183 | 8/1993 | Kanai | 250/453.11 |

FOREIGN PATENT DOCUMENTS

| | | | |
|---|---|---|---|
| 009137 | 1/1985 | Japan | 250/453.11 |
| 106439 | 4/1989 | Japan | 269/21 |

*Primary Examiner*—R. Bruce Breneman
*Assistant Examiner*—Jeffrie R. Lund
*Attorney, Agent, or Firm*—Fitzpatrick, Cella Harper & Scinto

[57] ABSTRACT

An X-stage is moved in an X direction (horizontal direction), and a Y-stage is moved in a Y direction (vertical direction) by linear motors. The gravitational force of the Y-stage is canceled out by a constant tension spring. Tensile force irregularity in the constant tension spring is measured in advance and stored in a tensile force irregularity compensation table. The tensile force irregularity is canceled out when a controller controls an auxiliary motor.

12 Claims, 9 Drawing Sheets

STAGE APPARATUS FOR AN EXPOSURE APPARATUS INCLUDING A CONTANT TENSION SPRING FOR CANCELING OUT A GRAVITATIONAL FORCE OF A MOVABLE STAGE BY A TENSILE FORCE

BACKGROUND OF THE INVENTION

1. Field of the Invention

The present invention relates to a vertical type stage apparatus used in an exposure apparatus or the like to vertically hold a substrate such as a wafer to be exposed.

2. Related Background Art

In the manufacture of semiconductor devices, further micropatterning of transfer patterns has recently been demanded with an increase in the capacity of a semiconductor memory. For this reason, an X-ray exposure apparatus using X-rays such as synchrotron radiation as exposure light has been developed. In such an X-ray exposure apparatus, a wafer to be exposed is generally held in a vertical position. A vertical type substrate stage apparatus like the one shown in FIG. 10 is used.

A vertical type substrate stage apparatus $E_0$ in FIG. 10 is constituted by an X-stage 102, a Y-stage 103, a wafer chuck 104, an X-driving unit (not shown), a pair of linear motors 105, and a constant tension spring 106. The X-stage 102 can reciprocate along an X-guide 102a, which is integrally formed with a base 101, in one direction (to be referred to as the X direction hereinafter) within a horizontal plane. The Y-stage 103 can reciprocate, in a vertical direction (to be referred to as the Y direction hereinafter), along a Y-guide 103a integrally formed with the X-stage 102. The wafer chuck 104 is arranged on the Y-stage 103. The X-driving unit serves to move the X-stage 102 in the X direction. The linear motors 105 drive the Y-stage 103 in the Y direction. The constant tension spring 106 serves to cancel out the gravitation of the Y-stage 103. Each linear motor 105 is constituted by a 10 linear motor stator 105a integrally formed with the X-stage 102, and a linear motor rotor 105b integrally formed with the Y-stage 103. The lower end of the constant tension spring 106 is integrally coupled to the Y-stage 103, while the upper end of the constant tension spring 106 is wound around a rotating shaft 106a rotatably supported on a bearing 103b integrally formed with the Y-guide 103a.

The wafer chuck 104 has a vertical suction surface 104a. The suction surface 104a chucks a wafer (not shown) by vacuum suction. The position of the wafer chuck 104 in the Y direction is monitored by a Y-interferometer 108a for receiving light reflected by a Y-mirror 107a mounted on one end of the Y-stage 103 in the Y direction. An output from the Y-interferometer 108a is negatively fed back to a Y-servo arithmetic unit 108b. The Y-servo arithmetic unit 108b drives each linear motor 105 to move the Y-stage 103 in the Y direction on the basis of the difference between a command signal transmitted through a command line 108c and the output from the Y-interferometer 108a. The position of the wafer chuck 104 in the X direction is monitored by an X-interferometer (not shown) for receiving light reflected by an X-mirror 107b mounted on one end of the Y-stage 103 in the X direction. An output from the X-interferometer is negatively fed back to an X-servo arithmetic unit (not shown). The X-servo arithmetic unit drives the X-driving unit to move the X-stage 102 in the X direction.

That is, the wafer chuck 104 is sequentially moved (step-moved) in the X and Y directions by necessary amounts while the positions of the wafer chuck 104 in the X and Y directions are monitored by light reflected by the X-mirror 107b and the Y-mirror 107a. With this operation, the wafer chuck 104 is moved to a position where a wafer is to be transferred, or each exposure region is positioned with respect to exposure light (not shown). In addition, the total gravitation of the Y-stage 103 is canceled out by the tensile force of the constant tension spring 106, whereby the load on each linear motor 105 can be reduced.

According to the above conventional technique, the constant tension spring for canceling out the gravitation of the Y-stage has a tensile force irregularity of ten-odd percent at maximum. The Y-stage has recently increased in weight with an increase in the diameter of a wafer. The total mass of the Y-stage is about several 10 to 100 kg. For this reason, a driving unit such as a linear motor which drives the Y-stage in the Y direction needs to have a thrust margin of several to ten-odd kg. In addition, since the maximum acceleration of the Y-stage is generally about 0.3 G, the maximum design value of the thrust for moving the Y-stage in the Y direction is 30 kg. The ratio of the above thrust margin to this design value is large. Consequently, the linear motor and the like must be considerably increased in size, and then the amount of heat generated by the linear motor may increase to cause thermal deformation of a substrate such as a wafer.

Furthermore, since the overall Y-stage is directly suspended by using the constant tension spring, the constant tension spring must be mounted at a position immediately above the Y-stage. If, therefore, dust is produced by friction between the constant tension spring and the rotating shaft around which the upper end of the spring is wound or friction occurs at the wound portion of the constant tension spring, the surface of a substrate such as a wafer may be contaminated.

SUMMARY OF THE INVENTION

The present invention has been made in consideration of the above problems of the conventional technique, and has as its first object to provide a stage apparatus and an exposure apparatus using the same which can cancel out tensile force irregularity in a constant tension spring.

It is the second object of the present invention to provide a stage apparatus and an exposure apparatus using the same in which a constant tension spring need not be directly coupled to a stage.

In order to achieve the first object, according to the present invention, there is provided a stage apparatus comprising a movable stage capable of moving in a predetermined direction including a gravitational component, driving means for moving the movable table, a constant tension spring for canceling out the gravitation of the movable table by a tensile force, and tensile force compensation means for compensating for a change in the tensile force.

In order to achieve the second object, according to the present invention, there is provided a stage apparatus comprising a movable stage capable of moving in a predetermined direction including a gravitational component, driving means for moving the movable table, and a constant tension spring for canceling out the gravitation of the movable table by a tensile force, the constant tension spring being coupled to the movable stage via a rotating member which rotates upon movement of the movable stage.

The load on the driving means is reduced by canceling out the gravitation of the movable stage by using the tensile force of the constant tension spring. Although the tensile force of the constant tension spring changes as the movable stage moves in a predetermined direction, such a change in tensile force can be compensated for by the tensile force compensation means to keep the tensile force of the constant tension spring constant. For this reason, the thrust margin of the driving means need not be increased. Therefore, the driving means can be reduced in size.

In addition, if the constant tension spring is coupled to the movable stage via the rotating member which rotates upon movement of the movable stage, the constant tension spring need not be directly coupled to the upper end of the movable stage. Therefore, contamination of a substrate such as a wafer on the movable table, which is caused by dust and the like produced at the wound portion of the constant tension spring, can be prevented by covering the constant tension spring with a cover or arranging it at a position other than a position immediately above the movable table.

DETAILED DESCRIPTION OF THE PREFERRED EMBODIMENTS

Embodiments of the present invention will be described below with reference to the accompanying drawings.

Figure 1:
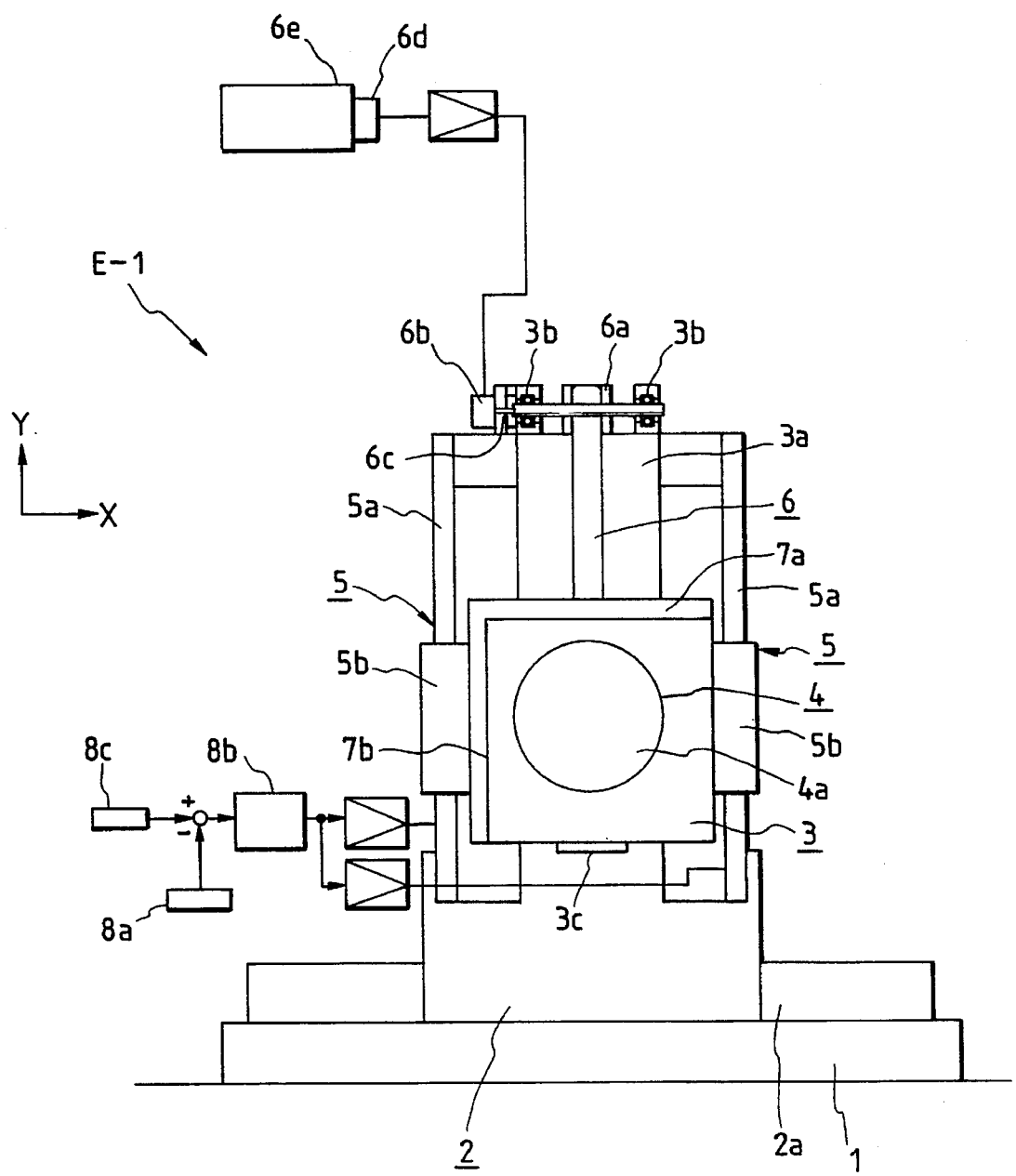
FIG. 1 is an elevation of the first embodiment of the present invention.

FIG. 1 is an elevation of the first embodiment of the present invention. A vertical type substrate stage apparatus E-1 of this embodiment is constituted by an X-stage 2, a Y-stage 3, a wafer chuck 4, an X-driving unit (not shown), a pair of linear motors 5, and a constant tension spring 6. The X-stage 2 can reciprocate along an X-guide 2a, which is integrally formed with a base 1, in one direction (to be referred to as the X direction hereinafter) within a horizontal plane. The Y-stage 3 is a movable stage which can reciprocate, in a vertical direction (to be referred to as the Y direction hereinafter), along a Y-guide 3a as a guide means integrally formed with the X-stage 2. The wafer chuck 4 is arranged on the Y-stage 3. The X-driving-unit serves to move the X-stage 2 in the X direction. The linear motors 5 serve as driving means for driving the Y-stage 3 in the Y direction. The constant tension spring 6 serves to cancel out the gravitation of the Y-stage 3. Each linear motor 5 is constituted by a linear motor stator 5a integrally formed with the X-stage 2, and a linear motor rotor 5b integrally formed with the Y-stage 3. The lower end of the constant tension spring 6 is integrally coupled to the Y-stage 3, while the upper end of the constant tension spring 6 is wound around a rotating shaft 6a rotatably supported on a bearing 3b formed in the Y-guide 3a.

The wafer chuck 4 has a vertical suction surface 4a. The suction surface 4a chucks a wafer (not shown) by vacuum suction. The position of the wafer chuck 4 in the Y direction is monitored by a Y-interferometer 8a for receiving light reflected by a Y-mirror 7a mounted on one end of the Y-stage 3 in the Y direction. An output from the Y-interferometer 8a is negatively fed back to a Y-servo arithmetic unit 8b. The Y-servo arithmetic unit 8b drives each linear motor 5 to move the Y-stage 3 in the Y direction on the basis of the difference between a command signal transmitted through a command line 8c and the output from the Y-interferometer 8a. The position of the wafer chuck 4 in the X direction is monitored by an X-interferometer (not shown) for receiving light reflected by an X-mirror 7b mounted on one end of the Y-stage 3 in the X direction. An output from the X-interferometer is negatively fed back to an X-servo arithmetic unit (not shown). The X-servo arithmetic unit then drives the X-driving unit to move the X-stage 2 in the X direction.

That is, the wafer chuck 4 is sequentially moved (step-moved) in the X and Y directions by necessary amounts while the positions of the wafer chuck 4 in the X and Y directions are monitored by light reflected by the X-mirror 7b and the Y-mirror 7a. With this operation, the wafer chuck 4 is moved to a position where a wafer is to be transferred, or each exposure region is positioned with respect to exposure light (not shown). In addition, the total gravitation of the Y-stage 3 is canceled out by the tensile force of the constant tension spring 6, whereby the load on each linear motor 5 can be reduced.

One end of the rotating shaft 6a is coupled to a motor shaft 6c of an auxiliary motor 6b serving as a tensile force compensation means. A controller 6d serving as a control means for controlling the rotation of the auxiliary motor 6b has a tensile force compensation table 6e serving as a storage means for storing information indicating tensile force irregularity in the constant tension spring 6 which is measured in advance by a method to be described later. The controller 6d controls the auxiliary motor 6b on the basis of this information so as to provide the rotating shaft 6a with a torque required to cancel out the tensile irregularity in the constant tension spring 6. An antivibration weight 3c is fixed to the lower end of the Y-stage 3. The weight 3c is added such that the tensile force of the constant tension spring 6 does not exceed the total weight of the Y-stage 3.

Figure 2:
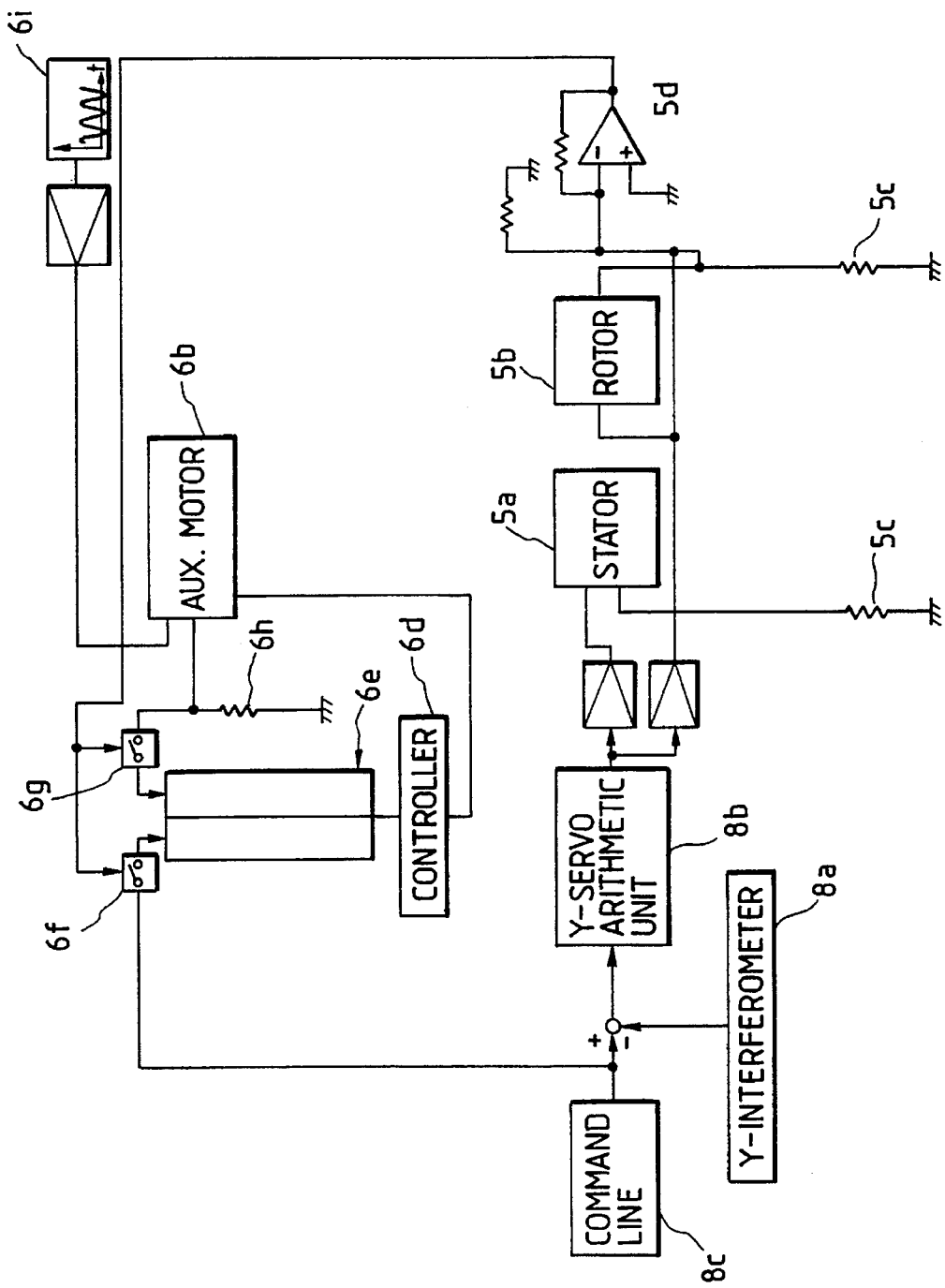
FIG. 2 is a block diagram for explaining a tensile force irregularity compensation table forming circuit in the first embodiment.

A method of measuring tensile force irregularity in the constant tension spring 6 and forming the tensile force compensation table 6e on the basis of the measured irregularity will be described next. As shown in the block diagram of FIG. 2, resistors 5c for detecting a linear motor current are connected to the linear motor stator 5a and of each linear motor rotor 5b of each linear motor 5. The sum of voltages obtained by the two resistors 5c is input to first and second gates 6f and 6g of the tensile force compensation table 6e via an operational amplifier 5d. The first gate 6f is connected to the command line 8c. The auxiliary motor 6b and an insufficient force detecting resistor 6h are connected to the second gate 6g. A function generator 6i is connected to the input side of the auxiliary motor 6b. The function generator 6i generates a driving signal, such as a sine wave or sawtooth wave, which periodically and continuously changes.

A predetermined command signal is transmitted to the first gate 6f and the Y-servo arithmetic unit 8b through the command line 8c to drive each linear motor 5 so as to move the Y-stage 3 to a commanded position in the Y direction. At the same time, the commanded position in the Y direction is stored in the tensile force compensation table 6e. A driving signal which periodically and continuously changes, is supplied from the function generator 6i to the auxiliary motor 6b to periodically and continuously change the tensile force of the constant tension spring 6. When the tensile force of the constant tension spring 6 becomes a value which cancels out the total weight of the Y-stage 3, an output from the operational amplifier 5d becomes zero, the first and second gates 6f and 6g are enabled, and the value of current supplied to the auxiliary motor 6b is stored in the tensile force compensation table 6e, together with the command signal from the command line 8c. That is, the value of the current supplied to the auxiliary motor 6b, which is required to cancel out the tensile force irregularity in the constant tension spring 6 at this time, is stored in the tensile force compensation table 6e, together with the Y-direction position of the Y-stage 3 which is commanded by the command signal. The tensile force compensation table 6e is formed by repeating the above operation while sequentially moving the Y-stage 3 to different positions in the Y direction. If a predetermined acceleration command is supplied to the auxiliary motor 6b to accelerate the Y-stage 3 at the same time when driving of each linear motor 5 is started by a command signal supplied through the command line 8c, the time required for step-movement of the Y-stage 3 can be greatly shortened.

As described above, since the tensile force irregularity in the constant tension spring 6 for canceling out the gravitation of the Y-stage 3 can be canceled out by a torque applied to the rotating shaft 6a by the auxiliary motor 6b, each linear motor 5 need not have a large thrust margin. Therefore, each linear motor 5 need not be considerably increased in size. In addition, since the amount of heat generated by the linear motor 5 is small, there is no possibility of thermal deformation of a substrate such as a wafer.

Instead of controlling the auxiliary motor 6b on the basis of data stored in advance in the tensile force compensation table 6e, a detector for detecting a change in the tensile force of the tensile force compensation table 6e in real time may be arranged so that tensile force irregularity in the constant tension spring 6 can be canceled out by feeding back an output from the detector to the auxiliary motor 6b.

Figure 3:
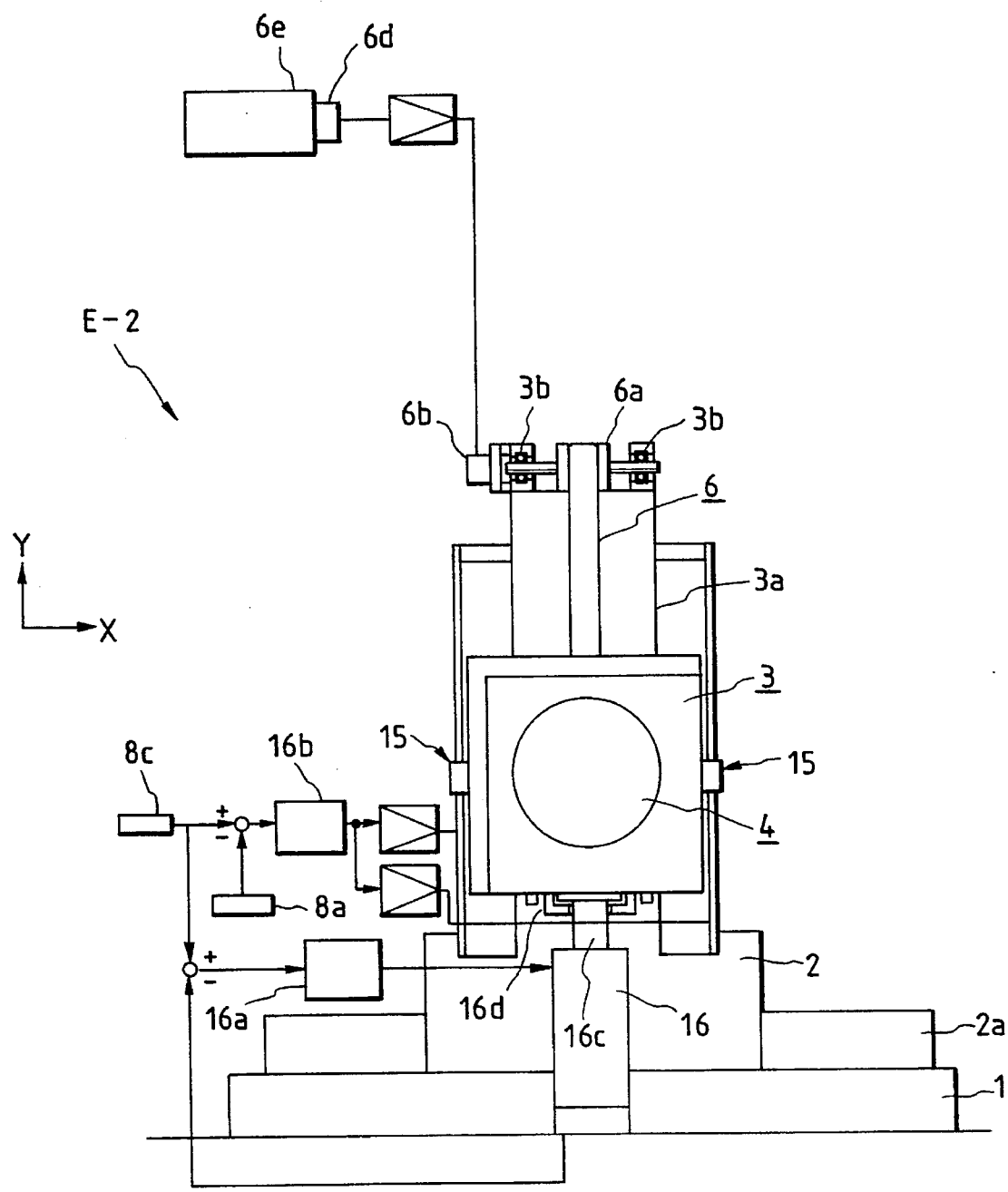
FIG. 3 is an elevation of the first modification of the first embodiment.

FIG. 3 shows the first modification of the first embodiment. A vertical type substrate stage apparatus E-2 of this modification includes a pair of ultra-small linear motors 15 for moving a Y-stage 3 by a very small amount in the Y direction and an electric cylinder 16 for step-moving the Y-stage 3 in the Y direction, in place of the linear motors 5 for moving the Y-stage 3 in the Y direction. The electric cylinder 16 is controlled by a first Y-servo arithmetic unit 16a which is driven in accordance with a command signal transmitted through a command line 8c. Each linear motor 15 is driven by a second Y-servo arithmetic unit 16b identical to the Y-servo arithmetic unit 8b in the embodiment to perform fine adjustment of the position of the Y-stage 3 in the Y direction after the Y-stage 3 is step-moved by the electric cylinder 16. Note that the electric cylinder 16 causes a rod 16c to project/withdraw in combination with a motor and a ball screw (neither of which are shown). The rod 16c is connected to the Y-stage 3 via a gap coupling 16d having a gap of several or several tens of microns. With this arrangement, fine adjustment performed by each linear motor 15 does not interfere with the Y-stage 3. According to this modification, tensile force irregularity in a constant tension spring 6 is canceled out by driving an auxiliary motor 6b by a controller 6d having a tensile force compensation table 6e. With this operation, the amount of heat generated by each linear motor 15 can be further reduced.

Figure 4:
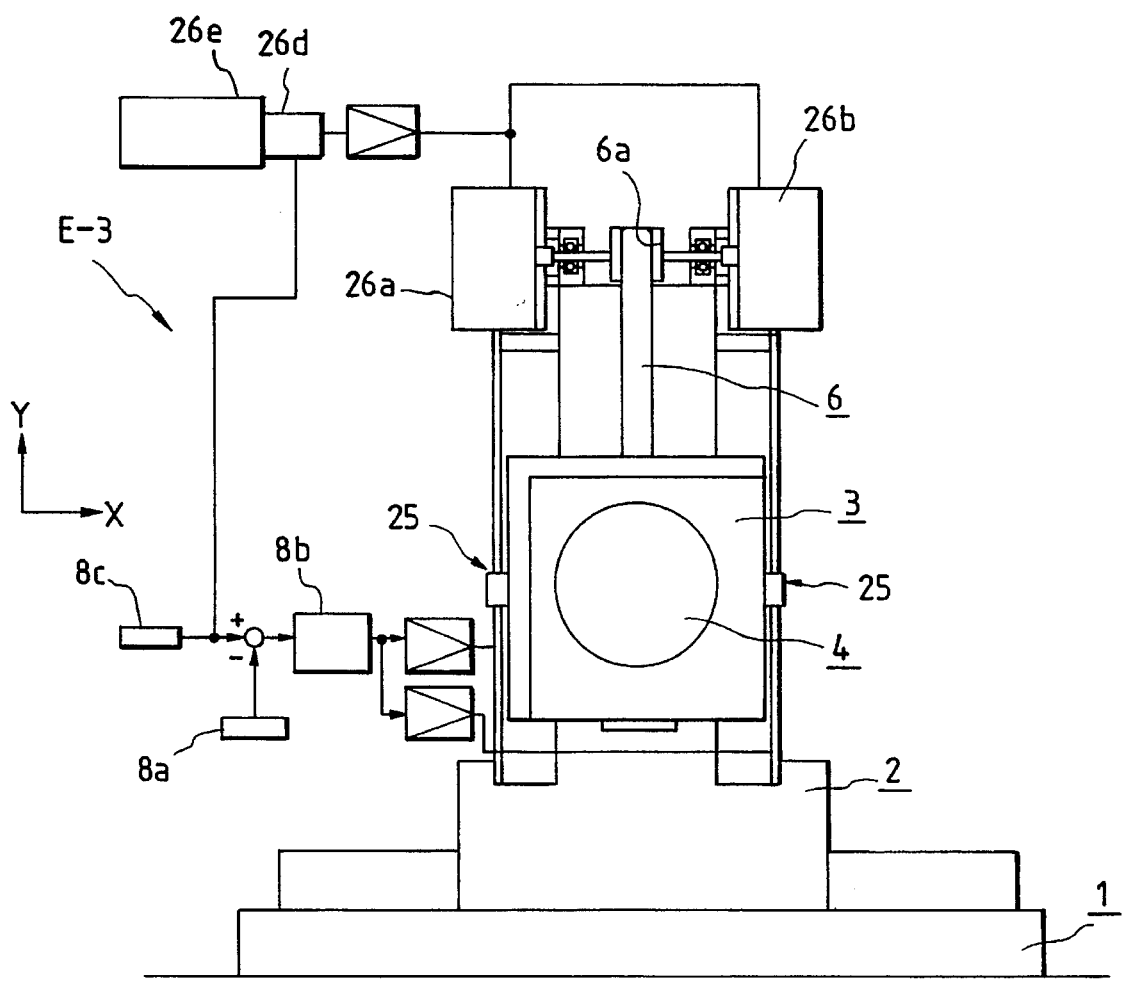
FIG. 4 is an elevation of the second modification of the first embodiment.

FIG. 4 shows the second modification of this first embodiment. A vertical type substrate stage apparatus E-3 of this modification includes a pair of ultra-small linear motors 25 for moving a Y-stage 3 by a very small amount in the Y direction and a pair of motors 26a and 26b for step-moving the Y-stage 3 in the Y direction by rotating a rotating shaft 6a around which a constant tension spring 6 is wound, in place of the linear motors 5 for step-moving the Y-stage 3 in the Y direction. In addition, a controller 26d for controlling the motors 26a and 26b includes a tensile force irregularity compensation table 26e for storing information indicating tensile force irregularity in the constant tension spring 6.

Figure 5:
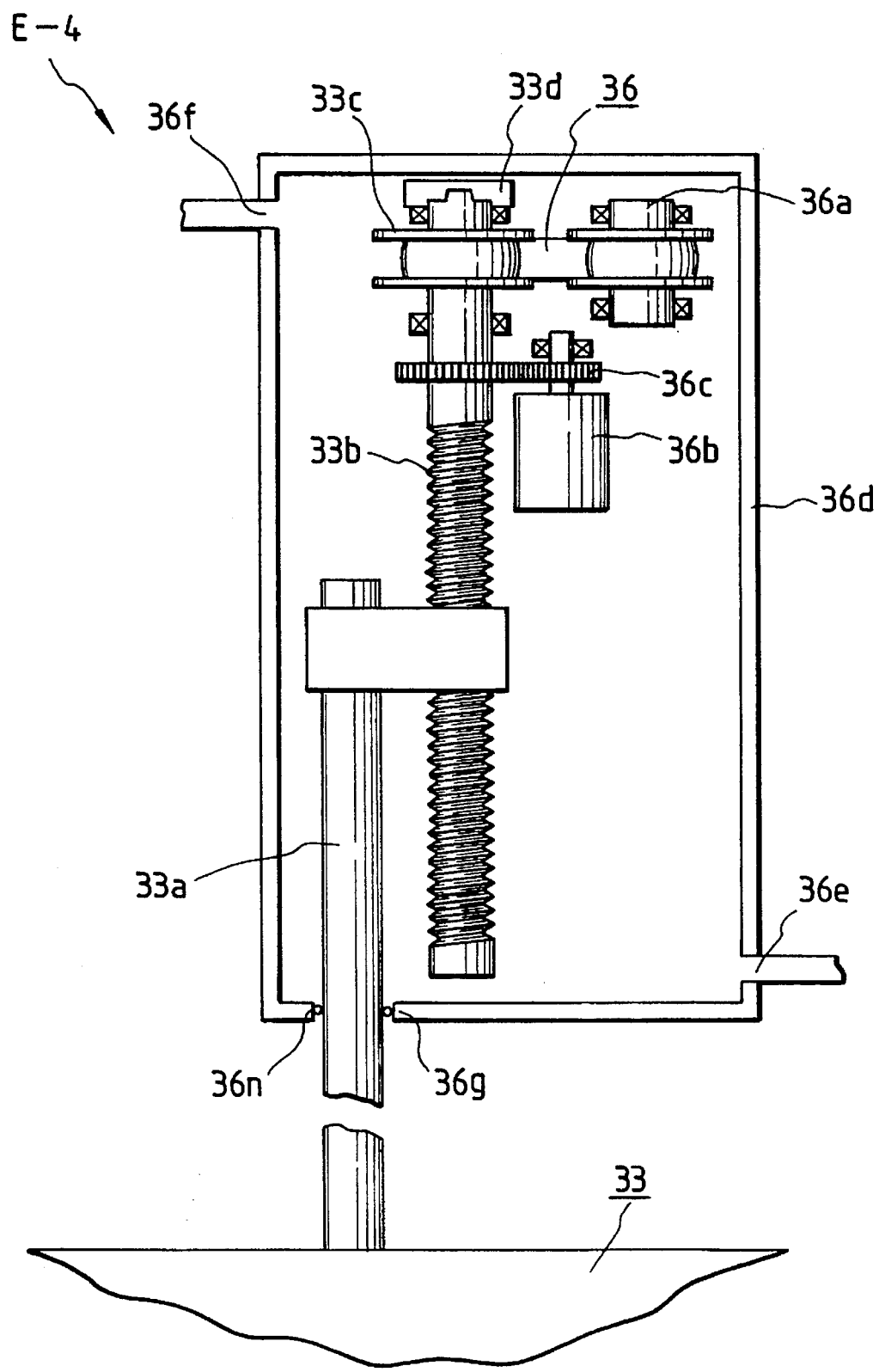
FIG. 5 is a sectional elevation of the main portion of the second embodiment of the present invention.
Figure 6:
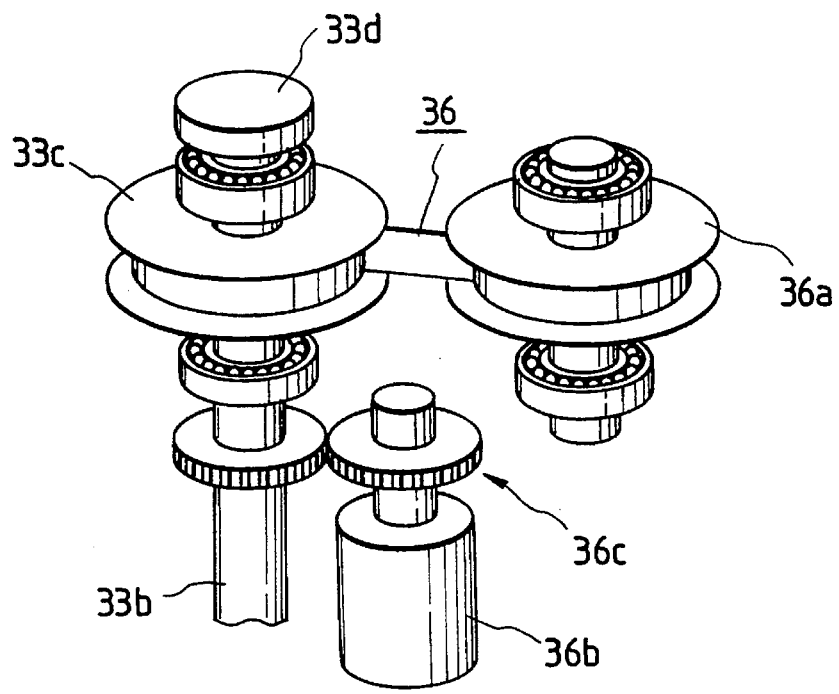
FIG. 6 is a perspective view of the main portion of the second embodiment.

FIG. 5 is a sectional elevation of the main portion of the second embodiment of the present invention. In a vertical type substrate stage apparatus E-4 of this embodiment, instead of using the constant tension spring 6 for directly suspending the Y-stage 3 of the first embodiment, a cylindrical shaft 33a is fixed to the upper end of a Y-stage 33 equivalent to the Y-stage 3, and one end of a constant tension spring 36 equivalent to the constant tension spring 6 is wound around a pulley 33c integrally formed with a ball screw 33b serving as a rotating member which is threadably engaged with a nut integrally formed with the cylindrical shaft 33a to vertically move the cylindrical shaft 33a, while the other end of the constant tension spring 36 is wound around a pulley integrally formed with a rotating shaft 36a. The Y-stage 33 is step-moved by linear motors (not shown) in the same manner as in the first embodiment.

A torque is applied to the ball screw 33b by an auxiliary motor 36b equivalent to the auxiliary motor 6b in the first embodiment via a gear train 36c so as to prevent an excessive load from being applied to each linear motor described above by tensile force irregularity in the constant tension spring 36. Note that a torque sensor 33d is arranged on one end of the ball screw 33b to measure tensile force irregularity in the constant tension spring 36 in advance, and the measured value is stored in a controller (not shown) equivalent to that in the first embodiment so as to control the auxiliary motor 36b. The ball screw 33b, the constant tension spring 36, the auxiliary motor 36b, the torque sensor 33d, and the like are arranged in a sealed cover 36d. The constant tension spring 36 has an exhaust port 36e and an inlet port 36f which serve to ventilate the atmosphere inside the cover 36d when dust is produced upon friction and the like at the wound portion of the constant tension spring 36.

Figure 7:
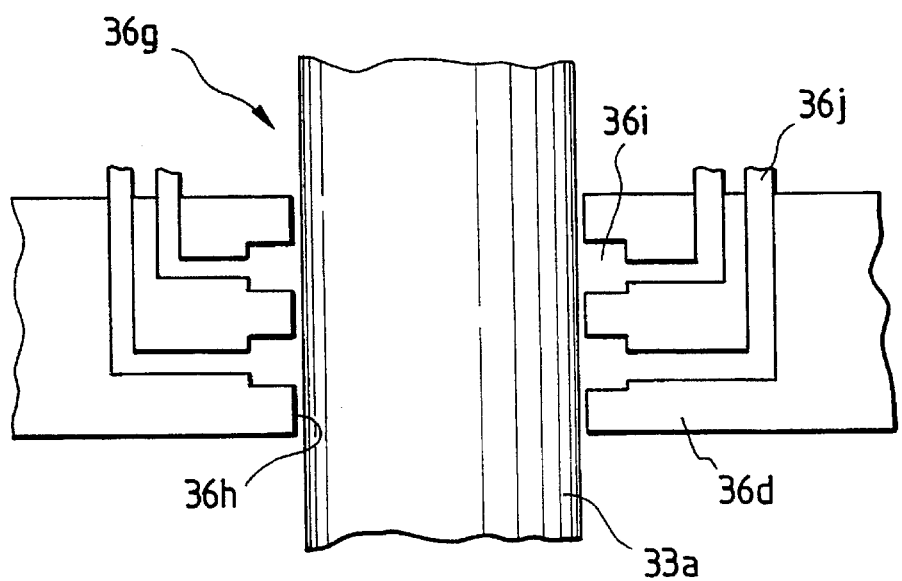
FIG. 7 is an enlarged sectional view of a vacuum seal portion in the second embodiment.

The cylindrical shaft 33a is inserted into the cover 36d via an opening 36h having a vacuum seal 36g. As shown in FIG. 7, the vacuum seal 36g is constituted by a labyrinth 36i arranged in the opening 36n of the cover 36d, and an exhaust line 36j for evacuating the labyrinth 36i. The clearance between the opening 36h and the cylindrical shaft 33a is set to be 20 microns or less.

According to this embodiment, the constant tension spring is coupled to the Y-stage via the cylindrical shaft and the ball screw instead of directly suspending the Y-stage by using the constant tension spring. For this reason, the mount position and shape of the constant tension spring are not limited by the size, path, and the like of the Y-stage. In addition, the constant tension spring, the ball screw, and the like are covered with the cover to prevent the wafer held on the Y-stage from being contaminated by dust produced upon friction and the like at the constant tension spring.

Figure 8:
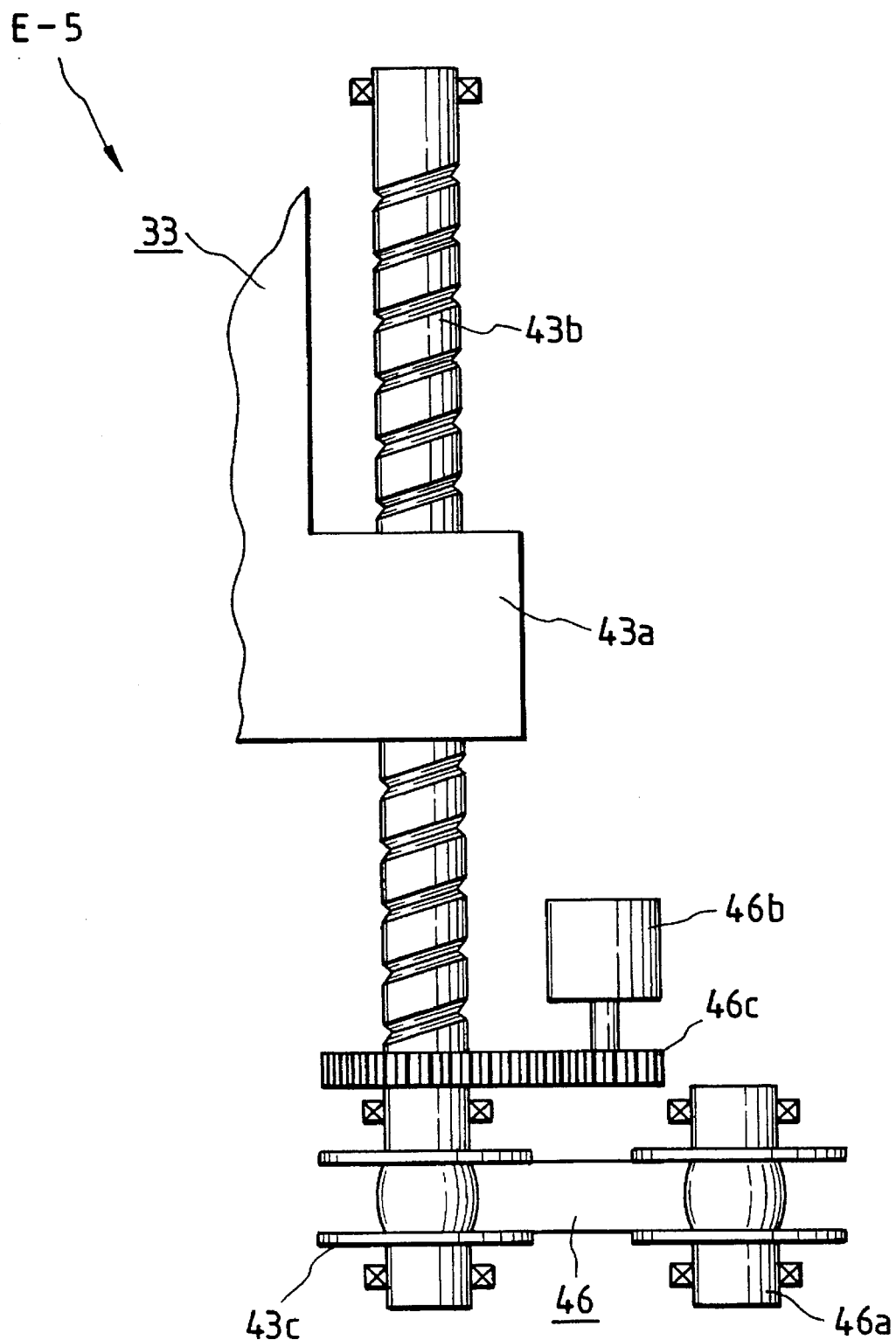
FIG. 8 is an elevation of the main portion of the first modification of the second embodiment.

FIG. 8 shows the main portion of the first modification of this second embodiment. A vertical type substrate stage apparatus E-5 of this modification uses a ball screw 43b for vertically moving a Y-stage 33 via a protruding member 43a arranged at the lower end of the Y-stage 33, instead of the ball screw 33b for vertically moving the Y-stage 33 in the embodiment via the cylindrical shaft 33a on the upper end of the Y-stage 33. A constant tension spring 46, a pulley 43c, a rotating shaft 46a, an auxiliary motor 46b, and a gear train 46c, which are equivalent to the constant tension spring 36, the pulley 33c, the rotating shaft 36a, the auxiliary motor 36b, and the gear train 36c in the embodiment, respectively, are arranged at the lower end of the ball screw 43b. A cover for preventing dust produced by the constant tension spring can be omitted by arranging the tension spring and the respective attachments at the bottom portion of the vertical type substrate stage apparatus. In addition, even if the tensile force of the constant tension spring exceeds the weight of the stage, there is no possibility of producing vibrations. Therefore, no antivibration weight is required.

Figure 9:
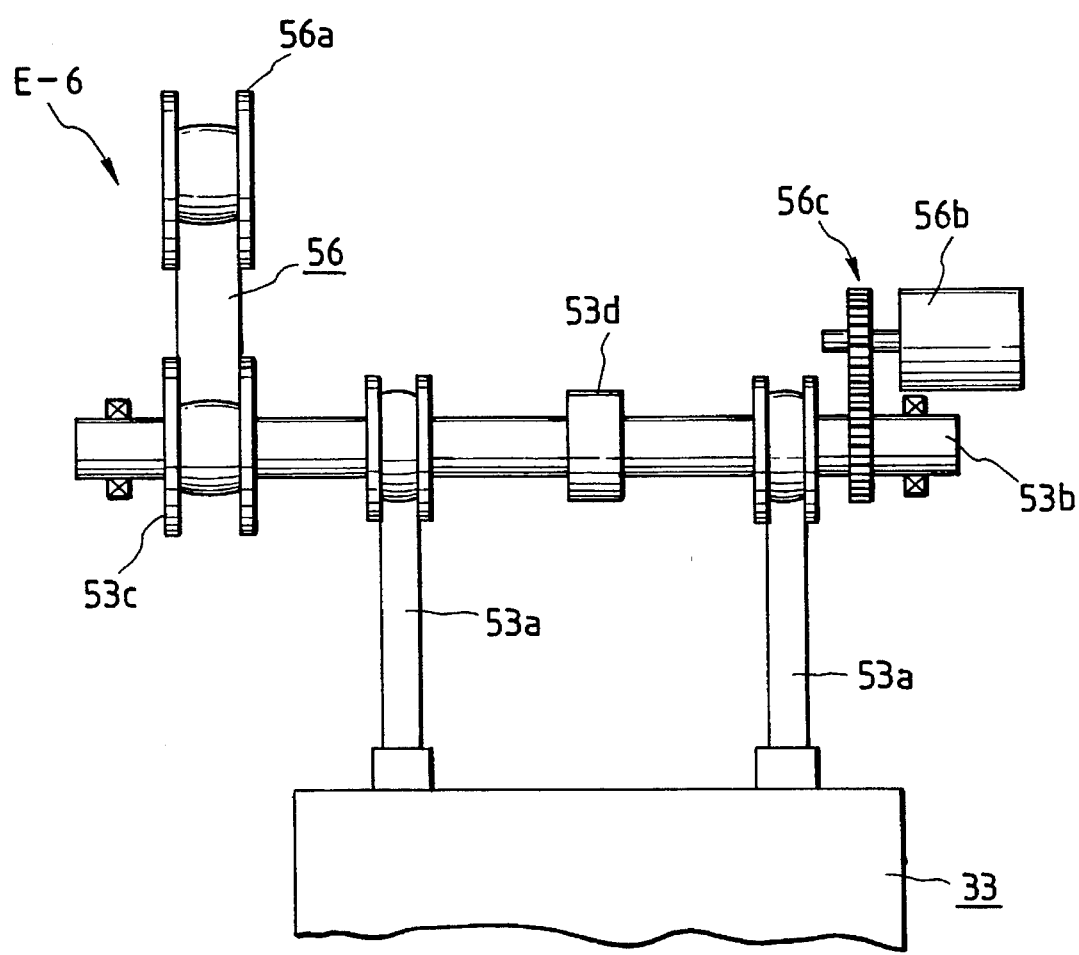
FIG. 9 is an elevation of the main portion of the second modification of the second embodiment.
Figure 10:
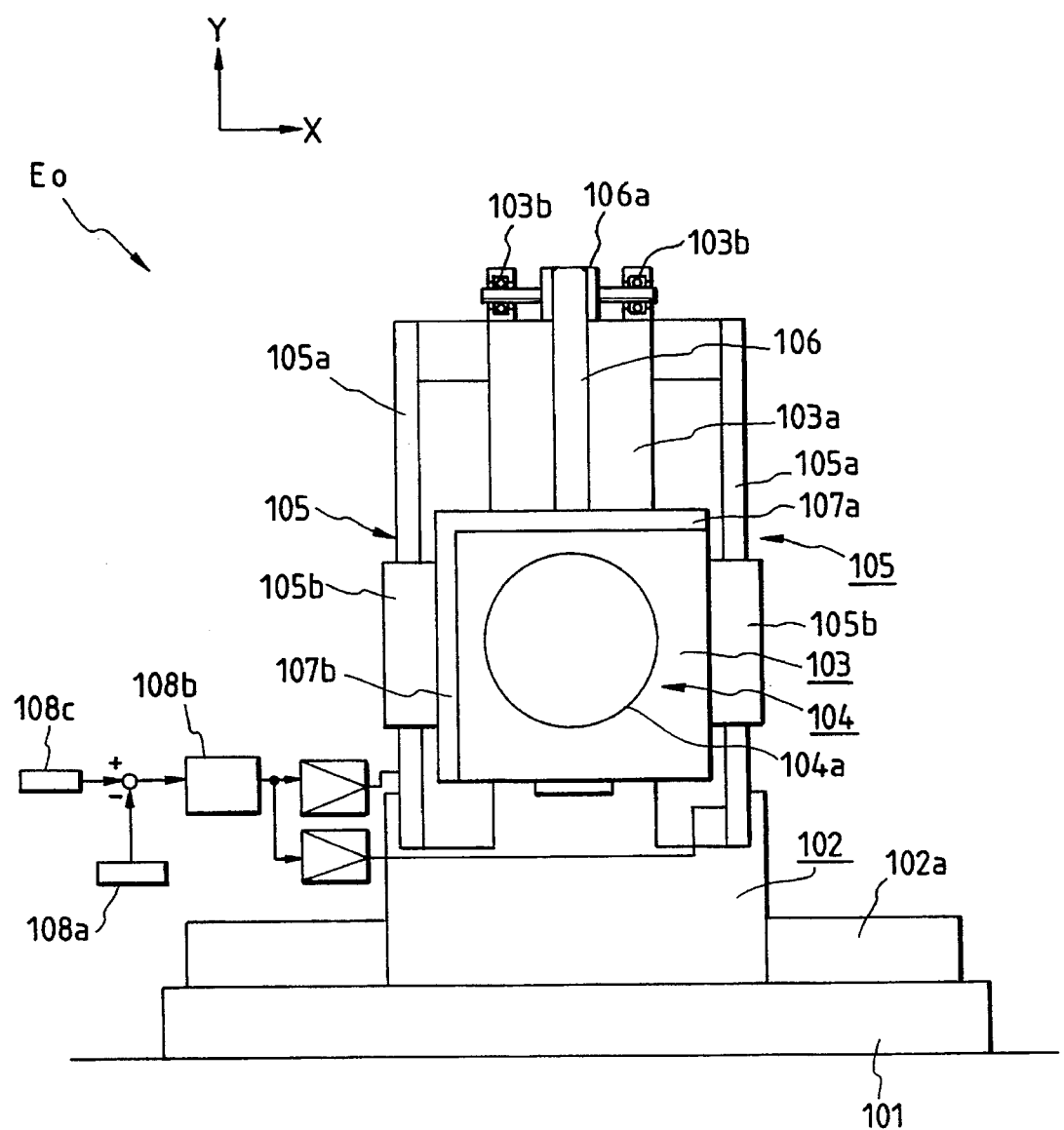
FIG. 10 is an elevation of a conventional apparatus.

FIG. 9 shows the main portion of the second modification of this second embodiment. In a vertical type substrate stage apparatus E-6 of this modification, a Y-stage 33 is suspended by using a pair of steel belts 53a, and the upper end of each steel belt 53a is wound around a rotating shaft 53b. In addition, one end of a constant tension spring 56 is wound around a pulley 53c integrally formed with the rotating shaft 53b, while the other end of the constant tension spring 56 is wound around a pulley 56a integrally formed with the other rotating shaft. The rotating shaft 53b is coupled to an auxiliary motor 56b via a gear train 56c. Similar to the auxiliary motor 36b in the embodiment, the auxiliary motor 56b is controlled by a controller (not shown) on the basis of tensile force irregularity in the constant tension spring 56 which is measured in advance by a torque sensor 53d. In this modification, the constant tension spring can also be arranged at an arbitrary position by changing the length of each steel belt or each rotating shaft. If, therefore, the constant tension spring and the like are arranged at a position where a wafer may not be contaminated by dust produced from the constant tension spring and the like, no cover is required.

What is claimed is:

1. A stage apparatus comprising:

a movable stage capable of moving in a direction including a gravitational component;

driving means for moving said movable stage;

a constant tension spring for canceling out the gravitational force of said movable stage by a tensile force; and tensile force compensation means, comprising means for generating a variable torque, for compensation for a change in the tensile force.

2. An apparatus according to claim 1, wherein a portion of said constant tension spring is wound around a rotating shaft, and said tensile force compensation means comprises a motor for rotating said rotating shaft.

3. An apparatus according to claim 2, wherein said motor comprises driving means, at least partly.

4. An apparatus according to claim 1, further comprising a function generator for driving said tensile force compensation means by using a driving force which periodically changes, storage means for storing the valve of the force supplied to said tensile force compensation means, and control means for controlling said constant tension spring on the basis of the driving force stored in said storage means.

5. A stage apparatus comprising:

a movable stage capable of moving in a direction including a gravitational component;

driving means for moving said movable stage; and a constant tension spring for canceling out the gravitational force of said movable stage by a tensile force, said constant tension spring being coupled to said movable stage via a rotating member which rotates upon movement of said movable stage.

6. An apparatus according to claim 5, wherein said rotating member is a ball screw threadably engaged with a nut integrally formed with said movable stage.

7. An apparatus according to claim 5, wherein said rotating member is adapted to wind up a belt for suspending said movable stage.

8. An apparatus according to claim 5, wherein at least said constant tension spring is covered with a cover.

9. An apparatus according to claim 5, wherein at least said constant tension spring is arranged at a position other than a position immediately above said movable stage.

10. An apparatus according to claim 5, further comprising tensile force compensation means, for compensating for a change in the tensile force of said constant tension spring, provided with said rotating member.

11. An exposure apparatus including a stage apparatus, comprising:

a movable stage mounting a substrate thereon and being capable of moving in a direction including a gravitational component;

driving means for moving said movable stage;

a constant tension spring for canceling out the gravitational force of said movable stage by a tensile force; and tensile force compensation means, comprising means for generating a variable torque, for compensation for a change in the tensile force.

12. An exposure apparatus including a stage apparatus, comprising:

a movable stage mounting a substrate thereon and being capable of moving in a direction including a gravitational component;

driving means for moving said movable stage; and a constant tension spring for canceling out the gravitational force of said movable stage by a tensile force, said constant tension spring being coupled to said movable stage via a rotating member which rotates upon movement of said movable stage.

* * * * *

UNITED STATES PATENT AND TRADEMARK OFFICE
CERTIFICATE OF CORRECTION

PATENT NO. : 5,518,550
DATED : May 21, 1996
INVENTOR(S) : NOBUSIGE KORENAGA, ET AL.

Page 1 of 2

It is certified that error appears in the above-indentified patent and that said Letters Patent is hereby corrected as shown below:

ON THE COVER PAGE:

In the Title, item [54]:

Line 2, "APPARATUS" should read --APPARATUS,--; and "CONTANT" should read --CONSTANT--.

In "Attorney, Agent, or Firm":

"Fitzpatrick, Cella Harper & Scinto" should read --Fitzpatrick, Cella, Harper & Scinto--.

COLUMN 1:

Line 2, "APPARATUS" should read --APPARATUS,--; and "CONTANT" should read --CONSTANT--.
　　Line 38, "10" should be deleted.

COLUMN 3:

Line 61, "X-driving-unit" should read --X-driving unit--.

COLUMN 4:

Line 55, "of each" should be deleted.

UNITED STATES PATENT AND TRADEMARK OFFICE
CERTIFICATE OF CORRECTION

PATENT NO. : 5,518,550   Page 2 of 2
DATED : May 21, 1996
INVENTOR(S) : NOBUSIGE KORENAGA, ET AL.

It is certified that error appears in the above-indentified patent and that said Letters Patent is hereby corrected as shown below:

COLUMN 7:

Line 53, "compensation" should read --compensating--.

COLUMN 8:

Line 4, "valve" should read --value--.
    Line 45, "compensation" should read --compensating--.

Signed and Sealed this

Third Day of December, 1996

Attest:

BRUCE LEHMAN

*Attesting Officer*   *Commissioner of Patents and Trademarks*